US010598689B2

(12) United States Patent
Zwahlen et al.

(10) Patent No.: US 10,598,689 B2
(45) Date of Patent: Mar. 24, 2020

(54) OUT-OF PLANE-ACCELEROMETER

(71) Applicant: Safran Colibrys SA, Yverdon-les-Bains (CH)

(72) Inventors: Pascal Zwahlen, Corcelles (CH);
Sophie Birling, Cheseaux-Noreaz (CH);
Bertrand Dutoit, Baulmes (CH)

(73) Assignee: SAFRAN COLIBRYS SA, Yverdon-les-Bains (CH)

( * ) Notice: Subject to any disclaimer, the term of this patent is extended or adjusted under 35 U.S.C. 154(b) by 126 days.

(21) Appl. No.: 15/837,007

(22) Filed: Dec. 11, 2017

(65) Prior Publication Data
US 2018/0164339 A1 Jun. 14, 2018

(30) Foreign Application Priority Data
Dec. 13, 2016 (EP) ..................... 16203854

(51) Int. Cl.
*G01P 15/125* (2006.01)
*G01P 15/18* (2013.01)
*G01P 1/02* (2006.01)
*G01P 15/08* (2006.01)
*B81B 7/02* (2006.01)
*B81B 3/00* (2006.01)
*B81B 7/00* (2006.01)

(52) U.S. Cl.
CPC .......... *G01P 15/125* (2013.01); *B81B 3/0062* (2013.01); *B81B 7/0048* (2013.01); *B81B 7/02* (2013.01); *G01P 1/023* (2013.01); *G01P 15/0802* (2013.01); *G01P 15/18* (2013.01); B81B 2201/0235 (2013.01); G01P 2015/0814 (2013.01); G01P 2015/0828 (2013.01)

(58) Field of Classification Search
CPC .... G01P 15/125; G01P 15/0802; G01P 15/18; G01P 1/02; G01P 1/023; G01P 2015/0822; G01P 2015/0825; G01P 2015/0828; G01P 2015/0831; G01P 2015/0837
See application file for complete search history.

(56) References Cited

U.S. PATENT DOCUMENTS

| 6,122,963 | A | * | 9/2000 | Hammond | ............ G01P 15/125 361/280 |
| 6,196,067 | B1 | * | 3/2001 | Martin | ................ G01P 15/0802 73/514.32 |
| 6,263,735 | B1 | * | 7/2001 | Nakatani | ............. G01P 15/0802 73/514.32 |
| 7,004,028 | B2 | * | 2/2006 | Park | ...................... G01P 15/125 73/514.32 |
| 2005/0132804 | A1 | | 6/2005 | Park et al. | |

(Continued)

FOREIGN PATENT DOCUMENTS

EP        0599174 A1   6/1994

*Primary Examiner* — Helen C Kwok
(74) *Attorney, Agent, or Firm* — Pearne & Gordon LLP

(57) ABSTRACT

Accelerometer including a seismic mass in a plane and a first capacitor plate and a second capacitor plate arranged parallel to the plane. The seismic mass is arranged in between the first capacitor plate and the second capacitor plate. The first capacitor plate and the second capacitor plate are configured to detect movements of the seismic mass out of the plane. A pillar extending from the first capacitor plate to the second capacitor plate through a cut-out in the seismic mass for stiffening the accelerometer.

13 Claims, 5 Drawing Sheets

(56) References Cited

U.S. PATENT DOCUMENTS

| | | | |
|---|---|---|---|
| 2011/0011182 A1 | 1/2011 | Yamaguchi et al. | |
| 2013/0269434 A1* | 10/2013 | Kamisuki | G01P 15/125 |
| | | | 73/514.32 |
| 2013/0319118 A1* | 12/2013 | Deng | G01H 11/08 |
| | | | 73/514.32 |
| 2017/0276698 A1* | 9/2017 | Bulatowicz | G01P 15/131 |
| 2018/0252744 A1* | 9/2018 | Kamada | G01P 15/125 |
| 2018/0372774 A1* | 12/2018 | Isobe | G01P 15/08 |
| 2019/0162752 A1* | 5/2019 | Isobe | G01P 15/125 |

\* cited by examiner

OUT-OF PLANE-ACCELEROMETER

FIELD OF THE INVENTION

The present invention concerns accelerometers, in particular out-of-plane accelerometers, and a method to manufacture them.

DESCRIPTION OF RELATED ART

Most accelerometers today are microelectromechanical systems (MEMS) devices. Such accelerometers have a seismic mass which will exhibit a displacement proportional to the acceleration. The mass displacement is sensed through capacitive detection. There are two types of accelerometers. In-plane accelerometers detect movements in the plane of the seismic mass, i.e. the capacitive system and the seismic mass are arranged in the same plane. This is for example realized by comb fingers on the mobile seismic mass relative to fixed comb fingers on the counter-electrode forming the capacitor. They have the advantage of cheap manufacturing and are used in most consumer electronics. Out-of-plane accelerometers detect accelerations by movements out of the plane of the seismic mass. Therefore, two capacitor plates are arranged in parallel configuration above and below the seismic mass. They have the disadvantage to be more complex in production, because the accelerometer is composed of a triple stack of wafer layers. However out-of-plane accelerometers reach higher signal-to-noise ratio.

A key performance parameter for accelerometers is the bias and the bias stability. A small bias in the acceleration detection can have large effects in certain applications. For example in inertial navigation applications, the position information is accessed through double integration over the acceleration signal. Any bias acceleration error will be accumulated over time with a square time dependency. It is tried to overcome this issue by calibrating and modelling the signal. However, such an approach is limited by the stability of the bias over time and temperature. Therefore, even the known out-of-plane accelerometers are not good enough for certain applications. For this reason it is desired to minimize both the raw initial bias which is especially due to assembly stress and its sources of variations like temperature and ageing.

One solution to reduce the assembly stress is a decoupling frame holding the sensor box with the two capacitor plates and the seismic mass by a decoupling beam as disclosed in EP0599174. This reduces the assembly stress transmitted to the sensor box and reduces the initial raw bias. However, this decoupling structure cannot prevent any bias created in the sensor box itself due to temperature changes or ageing effect. In addition, the decoupling beam is formed of two stacked wafer layer bonded together. This double stacked decoupling beam further reduces its ability to absorb elastic deformation due to high stress concentration at its frame anchor and will result in device failure. In addition, the decoupling frame is very difficult to mount on a package, because the decoupling frame is designed to be thin enough such as to bend under stress generated by the die attach, without transmitting too much of it to the sensitive part. Therefore, the surface to glue the decoupling frame on the package is very small and the mounting is cumbersome.

BRIEF SUMMARY OF THE INVENTION

Therefore, it is object of the invention to improve out-of-plane accelerometers to avoid or reduce the problems of the state of the art, in particular to reduce the raw bias and the bias stability.

According to the invention, these aims are achieved by means of an accelerometer comprising a seismic mass in a plane, itself acting as a capacitor plane, and a first capacitor plate and a second capacitor plate arranged parallel to the plane, wherein the seismic mass is arranged in between the first capacitor plate and the second capacitor plate, wherein the first capacitor plate and the second capacitor plate are configured to detect movements of the seismic mass out of the plane.

According to the invention, these aims are achieved by means of a method for manufacturing an accelerometer comprising the steps of: forming a first capacitor plate, a second capacitor plate and a seismic mass by wafer etching and arranging the seismic mass between the first capacitor plate and the second capacitor plate, so that the first capacitor is arranged in a first plane, the second capacitor is arranged in a third plane parallel to the first plane and the seismic mass is arranged in second plane parallel to the first plane.

The object is achieved in particular by one or any combination of the following measures:

In one embodiment, a pillar extending from the first capacitor plate to the second capacitor plate through a cut-out in the seismic mass for stiffening the accelerometer. This feature stiffens the sensor box of the accelerometer formed by the two capacitor plates and thus significantly reduces the bias sensitivity towards temperature spatial gradients and structural stress as for example from die attach.

In one embodiment, the seismic mass is supported via at least one elastic beam anchored to the pillar, wherein a first end of the at least one elastic beam is mechanically connected to the pillar and a second end of the at least one elastic beam is mechanically connected to the seismic mass. Therefore, the spring system is not fixed to a support at a lateral side of the mass frame, but in the central region of the seismic mass. Therefore, the anchor condition of the seismic mass remains more parallel to the capacitor plates and thus exhibits lower initial raw bias and further reduced bias instability over time.

In one embodiment, the cut-out in the seismic mass extends from the pillar to a first lateral side wall of the seismic mass, wherein the at least one elastic beam extends from the pillar through the cut-out to the first lateral side wall. This has the advantage that the elastic beam for the spring system of the seismic mass is arranged within the seismic mass and can thus extend longer without increasing the total size of the sensor box.

In one embodiment, the at least one elastic beam extends further along the first lateral side wall before it is connected to the seismic mass. This has the advantage that the spring system holding the seismic mass is composed of a first elastic beam portion in the cut-out which bends along its longitudinal axis and a second elastic beam portion along the lateral side wall which works in torsion mode. This increases the design options for configuring the spring parameters of the seismic mass. Preferably, the second end of the at least one elastic beam is connected to a corner of the seismic mass which has the advantage that the full lateral side of the seismic mass is used for the elastic beam.

In one embodiment, the at least one elastic beam comprises two elastic beams arranged symmetric to an axis of the cut-out extending from the pillar to the lateral side wall.

A beam extending through the cut-out connects the pillar with a mass frame, wherein the mass frame is mechanically connected with the first capacitor plate (bottom wafer) and the second capacitor plate (top wafer). Preferably, this mechanical connection or (wafer) bonding is achieved through a silicon oxide rim. Preferably, the mass frame extends circumferentially around all lateral sides of the seismic mass. If the seismic mass is rectangular, around all four sides of the seismic mass. However, it is also possible that the mass frame does not extend completely around the lateral sides of the seismic mass. Such a mass frame further stabilizes the sensor box formed by the first and second capacitor plates and the pillar.

In one embodiment, the seismic mass comprises a second lateral side wall opposite to the first lateral side wall, wherein the pillar is arranged in a centered region comprising fifty percent of the distance between the first lateral side wall and the second lateral side wall. The centered arrangement of the pillar has first the advantage that the best effect for stiffening the sensor box formed by the first and second capacitor plate is achieved. In addition, if the seismic mass is supported by an elastic beam anchored at the pillar, the better the pillar is centered, the more parallel seismic mass movement will be relative to the capacitor plates.

In one embodiment the seismic mass comprises a third lateral side wall opposite to a fourth lateral side wall (both not comprising the cut-out), wherein the pillar is arranged in a centered region comprising fifty percent of the distance between the third lateral side wall and the fourth lateral side wall. The advantage for the stiffness was explained before. In addition, if the seismic mass is supported by two elastic beams at the pillar, a symmetric arrangement of the elastic beams to the seismic mass can be achieved.

In one embodiment, the pillar is arranged in a central region comprising centered fifty percent of the distance between opposed lateral side walls. The benefits for the centered arrangement have been explained above. Preferably, the central region comprises centered thirty percent, preferably centered twenty-five percent, preferably centered twenty percent, preferably centered fifteen percent or preferably centered ten percent of the distance between the first and the second lateral side wall or between the opposed lateral side walls. This increases the described benefits.

In one embodiment, the accelerometer is a MEMS device.

In one embodiment, the accelerometer comprises a decoupling frame supporting via a decoupling beam a sensor box formed by the first capacitor plate, a mass frame arranged around the seismic mass and the second capacitor plate. The decoupling frame is fixed on the package resulting in assembly stress due to the die attach. Only a limited portion of this assembly stress is transferred to sensor box, thanks to the decoupling beam connecting one lateral side of the sensor box and the decoupling frame. It has been shown that the combination of both the pillar for stiffening the sensor box and the decoupling frame significantly reduces the raw bias and improves significantly the bias stability. This is achieved through both reduced die attach stress transmitted to the sensor box, thanks to the decoupling beam, and the stiffening of the sensor box thanks to the pillar. However, the decoupling frame could also be used without the pillar.

In one embodiment, the decoupling frame has first portions with a first width for adhesively connecting or gluing the decoupling frame to a package and second portions with a second width connecting two neighbouring first portions, wherein the first width is larger than the second width. This has the advantage that the decoupling frame can bend with the die attach stress thanks to the thin second portions and can nevertheless be glued on the package easily thanks to the large first portions. Preferably, the first portions are arranged at the corners of the decoupling frame.

In one embodiment, the decoupling frame comprises a first decoupling frame arranged in the first plane around the first capacitor plate, a third decoupling frame arranged in the third plane around the second capacitor plate and a second decoupling frame arranged in the second plane around the seismic mass and between the first decoupling frame and the second decoupling frame, wherein the first decoupling frame, the second decoupling frame and the third decoupling frame are stacked in order to form the decoupling frame. Preferably, the connection between the first to third decoupling frame is achieved by wafer bonding. Even if the decoupling frame is described here as extending over the first, second and third plane, it would also be possible that the decoupling frame extends only in the first and/or second plane.

In one embodiment, the first decoupling frame extends around four lateral sides of the first capacitor plate, wherein the first capacitor plate is connected with the at least one decoupling beam to the first decoupling frame at one of the four lateral sides.

In one embodiment, the second decoupling frame extends around four lateral sides of a mass frame connecting the first capacitor plate and the second capacitor plate, wherein the mass frame is connected with the at least one decoupling beam to the second decoupling frame at one of the four lateral sides.

In one embodiment, the third decoupling frame extends around four lateral sides of the second capacitor plate, wherein the second capacitor plate is connected with the at least one decoupling beam to the third decoupling frame at one of the four lateral sides.

In one embodiment, one or two of the other decoupling frames are open at the one of the four lateral sides. From a thermal point of view, the best option would be to have the decoupling beam in the second plane. This has the advantage that the decoupling beam is formed only in one of the wafer layers which improves stress decoupling and improves overall resistance to shock. Indeed, attaching two beams together generates high stress concentration resulting in weak shock absorbing capability yielding to early fracture.

In one embodiment, the first capacitor plate is wire bonded over the decoupling beam, the second capacitor plate is wire bonded over a finger attached to one of the four lateral sides and being parallel to the decoupling beam and the seismic mass is wire bonded over at least one finger attached to one of the four lateral side of the mass frame.

In one embodiment, the at least one finger attached to one of the four lateral sides of the mass frame is not mechanically connected or not wafer bonded to the decoupling beam. This avoids the stress caused by the mechanical connection or the bonding of two beams and avoids breakage of the accelerometer.

In one embodiment, the at least one finger attached to one of the four lateral sides of the mass frame comprises two fingers being arranged offset from the decoupling beam and/or from the finger attached to one of the four lateral sides of the second capacitor plate. This avoids that particles could be trapped between the decoupling beam and a finger and cause stress for the decoupling beam which could cause breakage of a beam or interruption of the electrical connection.

In one embodiment, the first capacitor plate and the second capacitor plate are each thicker than 350 micrometer, preferably than 400 micrometer, preferably than 450 micrometer, preferably than 500 micrometer, preferably than 550 micrometer, preferably than 600 micrometer or preferably than 650 micrometer. In one embodiment, the seismic mass is thicker than 350 micrometer, preferably than 400 micrometer, preferably than 450 micrometer or preferably than 500 micrometer. However, thicker thicknesses of the wafer layers, in particular of the first and second wafer layer, increase the stiffness of the sensor box and reduce thus the bias and increase the bias stability. Since the flexure of a plate depends on the third power of the thickness, an increased thickness has an enormous effect on the stiffness. This is in particular advantageous in combination with the pillar and/or the decoupling frame, but can also be applied alone.

In one embodiment, the manufacturing process of the accelerometer comprises the following steps: parts of the first plane of the accelerometer are etched together with many other parts of a first plane of other accelerometers out of a first wafer layer so that the parts of the first plane of different accelerometers remain connected; parts of the second plane of the accelerometer are etched together with many other parts of a second plane of other accelerometers out of a second wafer layer so that the parts of the second plane of different accelerometers remain connected; parts of the third plane of the accelerometer are etched together with many other parts of a third plane of other accelerometers out of a third wafer layer so that the parts of the third plane of different accelerometers remain connected; the etched first wafer layer, the etched second wafer layer and the etched third wafer layer are adhesively stacked such that the first capacitor, the seismic mass and the second capacitor of each accelerometer are arranged above each other; and the accelerometer is formed by cutting out the stack formed by the parts of the first plane, of the second plane and of the third plane of the accelerometer.

In one embodiment, the wafer etching in particular of the second wafer layer is done by plasma etching, preferably by Deep reactive-ion etching (DRIE). Compared to anisotropic wet etching as for instance potassium hydroxide (KOH), this allows to realize vertical sidewalls in a wafer layer and thus to realize smaller openings in the wafer layer. Therefore, the surface of the seismic mass can be maximised compared to the cut-out necessary for the spring system, the pillar and/or the mass frame. Thus, the same capacitive values can be achieved with smaller accelerometers which are stiffer and thus less sensible to bias and bias instability. This technology becomes in particular advantageous for thicker wafer layers for which the old technology like KOH implies larger openings between two parts of the same wafer layer. Since the openings in the first and second wafer layer involve quite large distances, they could also be etched by wet etching like KOH etching without compromising on the overall accelerometer dimension.

In one embodiment, silicon fusion bonding technology is used for connecting the first wafer layer, the second wafer layer and the third wafer layer. A silicon oxide rim is used as interface between the wafer layers. Using silicon only materials and its oxidized state avoids joining heterogeneous materials at the bond interface, which would otherwise face stress relaxation issue over time. Silicon Fusion Bonding technology is for that purpose used to reduce ageing drift.

The described individual measures reduce the bias and increase the bias stability, but in particular any combinations of these measures show a significant improvement of the bias of the accelerometer.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
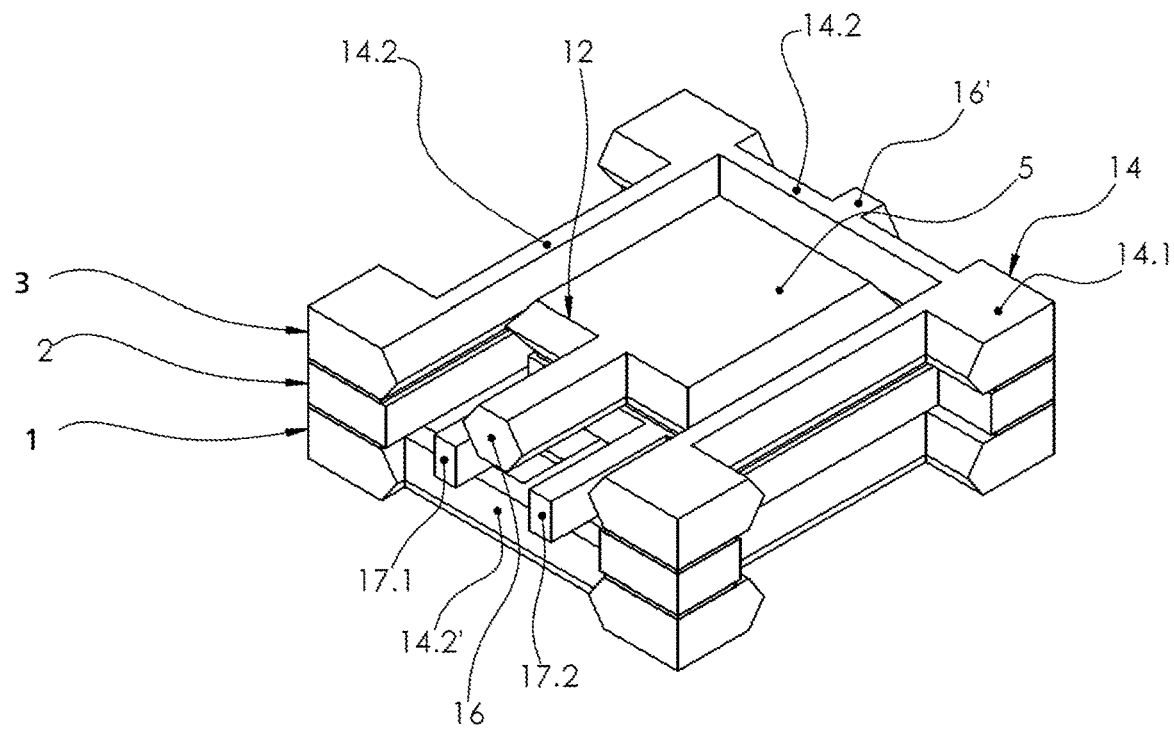
FIG. 1 shows a three-dimensional view of the accelerometer.

FIGS. 1 to 4 show different views of an exemplary embodiment of an accelerometer.

The accelerometer comprises a sensor box 12 and a decoupling structure 14.

The accelerometer is formed of parts arranged in three different parallel planes. The parts of the accelerometer arranged in the first plane are formed preferably out of a first wafer layer 1. The parts of the accelerometer arranged in the second plane are formed preferably out of a second wafer layer 2. The parts of the accelerometer arranged in the third plane are formed preferably out of a third wafer layer 3.

The sensor box 12 comprises a first capacitor plate 4 in the first plane, a second capacitor plate 5 in the third plane, a seismic mass 6 and a mass frame 7 in the second plane.

The mass frame 7 is arranged between the first capacitor plate 4 and the second capacitor plate 5 and connected to the first capacitor plate 4 and the second capacitor plate 5 in a fixed positional relationship (rigid link). The term connected herein means any constructional or mechanical connection if not otherwise specified, e.g. electrically connected. Constructional or mechanical connection could be an integral connection formed/etched out of the same material block/wafer layer and/or any other physical connection like adhesive connection, wafer bonding, silicon fusion bonding, etc. In a preferred embodiment, the mass frame 7, the first capacitor plate 4 and the second capacitor plate 5 are made of silicon and are connected by a silicon oxide rim 7.1. The silicon oxide rim 7.1 has the function of connecting the parts, of creating a well-defined gap or distance between the second wafer layer 2 and the first and third wafer layer 1 and 3, i.e. between the seismic mass 6 and the first and second capacitor plate 4 and 5, and/or of electrically insulating the first capacitor plate 4 and the second capacitor plate 5 from the seismic mass 6 and/or the mass frame 7. Preferably, the mass frame 7 and the seismic mass 6 are on the same electrical potential. In a preferred embodiment, the mass frame 7 is arranged to hermetically enclose the seismic mass 6 between the first capacitor plate 4 and the second capacitor plate 5. This has the advantage that no disturbing particles can enter the sensor box 12 and that the seismic mass 6 can be arranged in a well-defined condition like pressure and gas composition. Preferably, the mass frame 7 forms lateral walls for a rectangular sensor box 12.

The seismic mass 6 is arranged between the first capacitor plate 4 and the second capacitor plate 5 and is free to move between the first capacitor plate 4 and the second capacitor plate 5 in a direction substantially perpendicular to the first, second and/or third plane. Preferably, the seismic mass 6 is elastically attached to the mass frame 7. Preferably, the seismic mass 6 has a plate shape with a thickness corresponding to the second wafer layer 2. Preferably, the thickness of the seismic mass 6 is thicker than 350 micrometer (μm), preferably than 400 μm, preferably than 450 μm. Preferably, the seismic mass 6 is 500 μm thick. Compared to state-of-the-art, this second wafer layer 2 and thus the seismic mass 6 and/or the mass frame 7 is much thicker in order to increase the seismic mass frame 7 rigidity thus reducing the sensitivity to mechanical stress or to temperature changes. Preferably, the seismic mass 6 has a rectangular shape with four lateral side walls 6.1 to 6.4.

Figure 5:
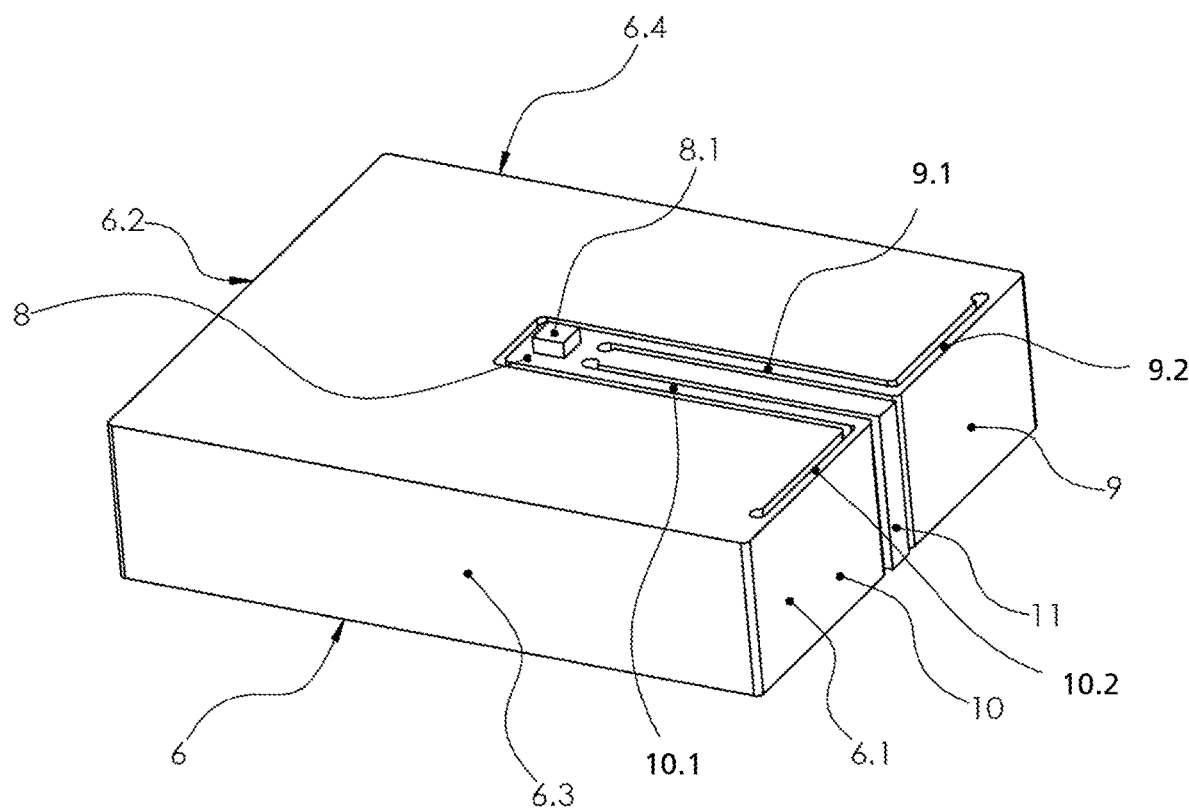
FIG. 5 shows a three-dimensional view of the seismic mass of the accelerometer.

In one embodiment, the seismic mass 6 has a cut-out through which a pillar 8 is connected to the first capacitor plate 4 and the second capacitor plate 5 as shown in an exemplary embodiment in FIG. 5. This stiffens the sensor box 12 and decreases the sensitivity to assembly stress, to temperature changes and to ageing. The connection between the pillar 8 and the first and second capacitor plates 4 and 5 is preferably achieved by silicon fusion bonding, i.e. by silicon oxide layer 8.1. Preferably, the pillar 8 is arranged in a central region covering the centered 50%, preferably the centered 40%, preferably the centered 30%, preferably the centered 25%, preferably the centered 20%, preferably the centered 15% or preferably the centered 10% between the lateral side walls of the seismic mass 6. Most preferably, the pillar is arranged in the center of the seismic mass 6. The more centered the pillar is, the stiffer becomes the sensor box 12 and the more symmetric is the assembly stress distribution over the sensor box 12. It is also possible that the sensor box 12 has multiple pillars between the first and the second capacitor plates 4 and 5 going through corresponding cut-outs of the seismic mass 6. Such a multiple pillar concept is described in a second embodiment in FIG. 7. It is further possible to realize the sensor box 12 without a pillar.

Figure 6:
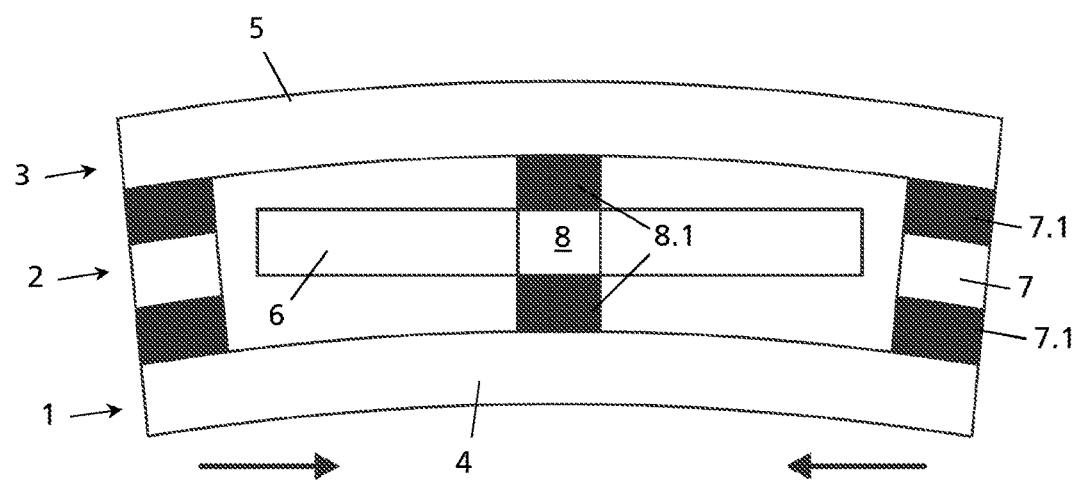
FIG. 6 shows a schematic function of the seismic mass in the sensor box.

In one embodiment as shown in FIG. 5, the pillar 8 supports the seismic mass 6 through at least one elastic beam, preferably through two elastic beams 9 and 10. This has the advantage that a flexure of the sensor box 12 would not influence the seismic mass 6, because the seismic mass 6 is attached to the (central) pillar 8 which is not subject to bending. FIG. 6 shows schematically how the seismic mass 6 becomes independent from bending stress acting on the sensor box 12. Preferably, the two elastic beams 9 and 10 are arranged symmetrically to the longitudinal axis of the cut-out. The longitudinal axis extends in the second plane from the pillar 8 to a first lateral side wall 6.1 of the seismic mass 6. The first elastic beam 9 extends with a first portion 9.1 from the pillar 8 through the cut-out to the first lateral side wall 6.1 of the seismic mass 6 and extends then with a second portion 9.2 along the first lateral side wall 6.1 before being fixed to the seismic mass 6. Preferably, the second portion 9.2 is fixed at a corner of the lateral side wall. Preferably, the longitudinal axis of the first portion 9.1 and the longitudinal axis of the second portion 9.2 are arranged perpendicular to each other in the plane of the seismic mass 6. The second elastic beam 10 is arranged symmetrically to the first elastic beam 9 and the features of the first elastic beam 9 apply analogously. Even, if the support of the seismic mass 6 on the pillar is particularly advantageous, it is also possible to support the seismic mass 6 by elastic beams with the mass frame 7. There are many other ways to elastically fix the seismic mass 6 in the sensor box 12.

In the shown embodiment, the pillar 8 is connected with a beam 11 to the mass frame 7. This allows for example to electrically route the seismic mass electrode signal to the mass frame 7. This allows that the positional relationship between the mass frame 7 and the pillar 8 is maintained between the manufacturing steps of etching and of connecting or wafer bonding the pillar 8 and the mass frame 7 to the first capacitor plate 4 and the second capacitor plate 5. Preferably, the beam 11 is arranged between the (first portion 9.1 of the) first elastic beam 9 and the (first portion 10.1 of the) second elastic beam 10. Preferably, the pillar 8 is integrally connected with the beam 11 and the mass frame 7 meaning that the pillar 8, the beam 11 and the mass frame 7 are made out of the same material piece.

Figure 7:
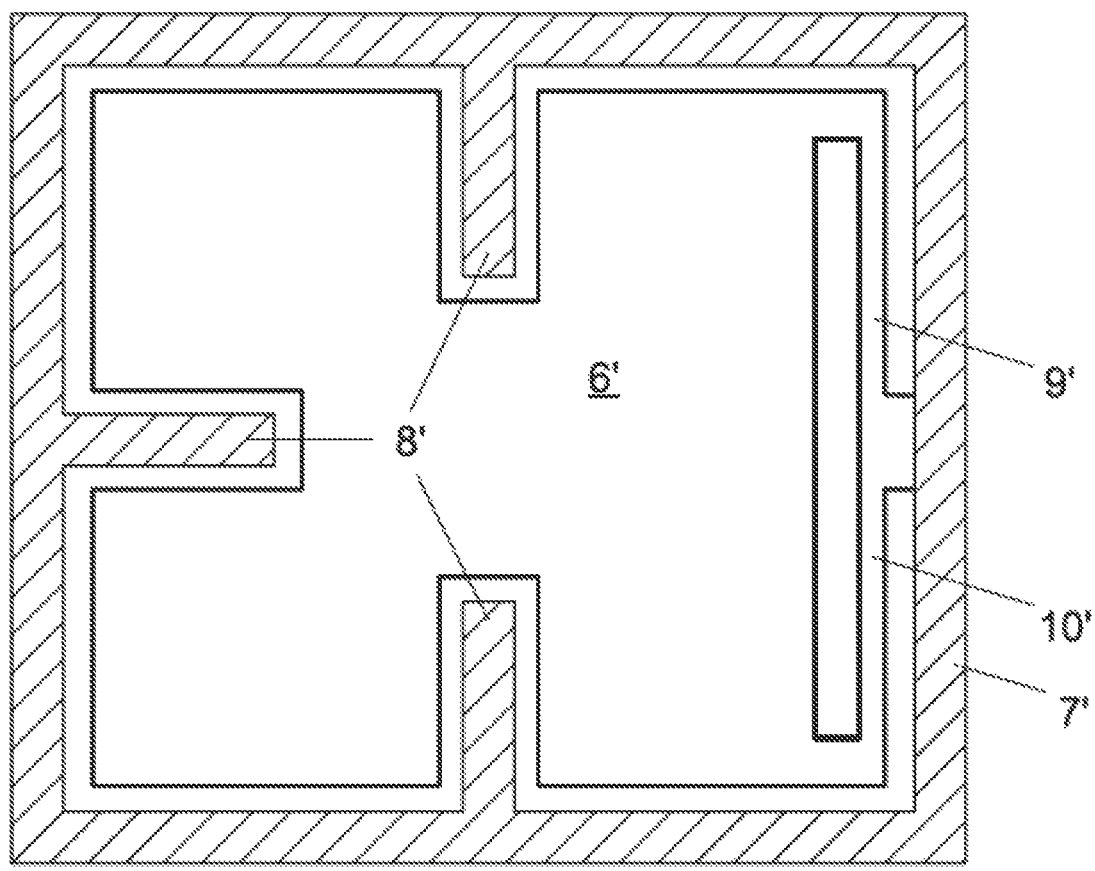
FIG. 7 shows a cross-sectional view of the seismic mass and the mass frame of a second embodiment of the accelerometer.

In an alternative embodiment, the pillar 8' can also extend from the mass frame 7' into a lateral cut-out in the seismic mass 6' as shown for example in FIG. 7. FIG. 7 shows an alternative embodiment for stabilizing the sensor box through at least one pillar 8'. Here multiple pillars 8' are arranged in the lateral cut-outs of the seismic mass 6', here on three lateral sides of the seismic mass 6'. The seismic mass 6' can also be anchored through an elastic member 9' to the lateral part of the mass frame 7' as shown in FIG. 7 instead of an anchor to the pillars 8'.

The first capacitor plate 4 and the second capacitor plate 5 are arranged on both sides of the seismic mass 6 and parallel to the seismic mass 6. The first capacitor plate 4 is arranged in the first plane and the second capacitor plate 5 is arranged in the third plane. The first capacitor plate 4 and seismic mass 6 are arranged to form a first capacitance. The second capacitor plate 5 and the seismic mass 6 are arranged to form a second capacitance. Preferably, the first and second capacitor plate 4 and 5 are respectively electrically connected with an accelerometer circuit for providing the first and second capacitor with an electrical signal (AC signal). Preferably, the seismic mass 6 working here as a capacitor plate for the first and second capacitances is connected, preferably over the mass frame 7, with the read-out circuit of the accelerometer for detecting a capacitance change as a result of a seismic mass 6 displacement when submitted to an input acceleration. The capacitances of the first and of the second capacitor depend on the position of the seismic mass 6. Therefore, the position of the seismic mass 6 can be extracted from the difference between the first and the second capacitances. Since the position of the seismic mass 6 depends on the acceleration, the acceleration can be detected from the position of the seismic mass 6 and/or from the measured differential capacitance between first and second capacitances. Alternatively, the accelerometer through its first and second capacitances can be used in a force rebalancing loop operating principle, using the same capacitor plates 4 and 5 and the seismic mass 6. The mechanical design improvements benefit to both the open-loop approach and the servo-loop approach. Preferably, the thickness of the capacitor plates 4 and 5 is thicker than 500 micrometer (μm), preferably than 550 μm and preferably than 600 μm. Preferably, the capacitor plates 4 and 5 are 625 μm thick. Compared to state-of-the-art, the first and/or second capacitor plates 4 and 5 or the first and/or third wafer layers 1 and 3 are much thicker in order to increase the capacitor plate rigidity thus reducing the sensitivity to mechanical stress or to temperature changes. The deliberate choice for thick wafer layers resulting in thick capacitor plates 4 and 5 increases the rigidity of the capacitor plates 4 and 5 and thus reduces the sensitivity to mechanical stress or to temperature changes.

The decoupling frame 14 is arranged to be attached on a package and to support the sensor box 12 via a decoupling beam 15. Preferably, the decoupling beam 15 is arranged only on one lateral side of the sensor box 12 and/or only one decoupling beam 15 supports the sensor box 12 on the decoupling frame 14. Thus, the sensor box 12 is not connected directly with the package, but only through the decoupling beam 15. This decouples most of the assembly stress resulting from the die attach.

In the shown embodiment, the decoupling frame 14 comprises first portions 14.1 with a large width, so-called attach-islands, for attaching the decoupling frame 14 on the package and second portions 14.2 with a small width which connects two neighbouring first portions 14.1. The second portions 14.2 are more flexible and are adapted to elastically deform with assembly stress without breaking. Therefore, this embodiment has the advantage that the decoupling frame 14 can be easily glued on the package via the attach-islands while the decoupling frame stays flexible for absorbing the stress of the die attach. Preferably, the attach-islands 14.1 are arranged at the four corners of the decoupling frame 14, but other arrangements and other numbers of attach-islands are also possible. For example the attach islands could also be arranged between two corners.

In the present embodiment, the decoupling frame 14 extends over different planes, here from the first plane over the second plane to the third plane. However, in another embodiment, the decoupling frame 14 could extend also only in the first plane. In the case that the decoupling frame 14 extends over different planes, the decoupling frame layers are adhesively connected or silicon fusion bonded to form the decoupling frame 14. In the shown embodiment, the decoupling frame 14 is closed on three lateral sides by the second portions 14.2. The lateral side of the decoupling frame 14 supporting the decoupling beam 15 is closed by the second portion 14.2' in the first plane of the decoupling frame 14 and is open in the second and third plane of the decoupling frame 14. The beam 14.2' in the first plane allows to support the sensor box 12 through the decoupling beam. In another embodiment, the decoupling frame 14 could be closed in the second plane (center plane) and the sensor box 12 could be supported by the decoupling beam 15 in the second plane, while the first and second plane of the decoupling frame 14 is open on the lateral side with the decoupling beam 15. This would further improve the temperature distribution of the sensor package 12, because the heat flow would be more symmetrically distributed around the second plane and thus reduces further the bias shift caused by temperature spatial gradient.

In a preferred embodiment, the accelerometer is manufactured in two principal steps.

In a first step, the parts of the first plane (the first capacitor plate 4, the decoupling frame 14 in the first plane, the decoupling beam 15) are etched in from the first silicon wafer layer 1, the parts of the second plane (the seismic mass 6, the mass frame 7, the decoupling frame 14 in the second plane) are etched in the second silicon wafer layer 2 and the parts of the third plane (the second capacitor plate 5, the decoupling frame 14 in the third plane) are etched in the third silicon wafer layer 3. Any type of wafer etching technology is possible. Wet etching like potassium hydroxide (KOH) etching or plasma etching like deep reactive-ion etching (DRIE) is possible. In particular, it is advantageous to use DRIE for etching the parts from the second wafer layer 2 in order to obtain a more compact design which improves further the rigidity of the sensor box 12. DRIE achieves more compact designs, because vertical or perpendicular lateral walls can be etched.

In a second step, the etched parts are assembled together as described above.

Figure 2:
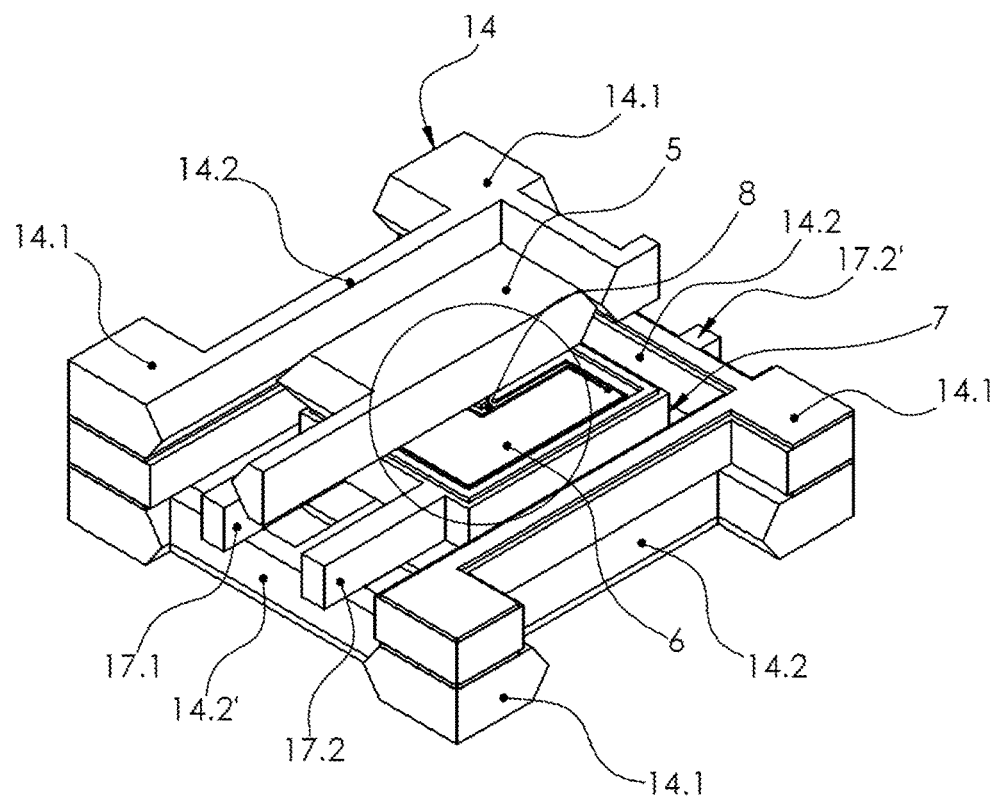
FIG. 2 shows cut open view of the accelerometer of FIG. 1.
Figure 3:
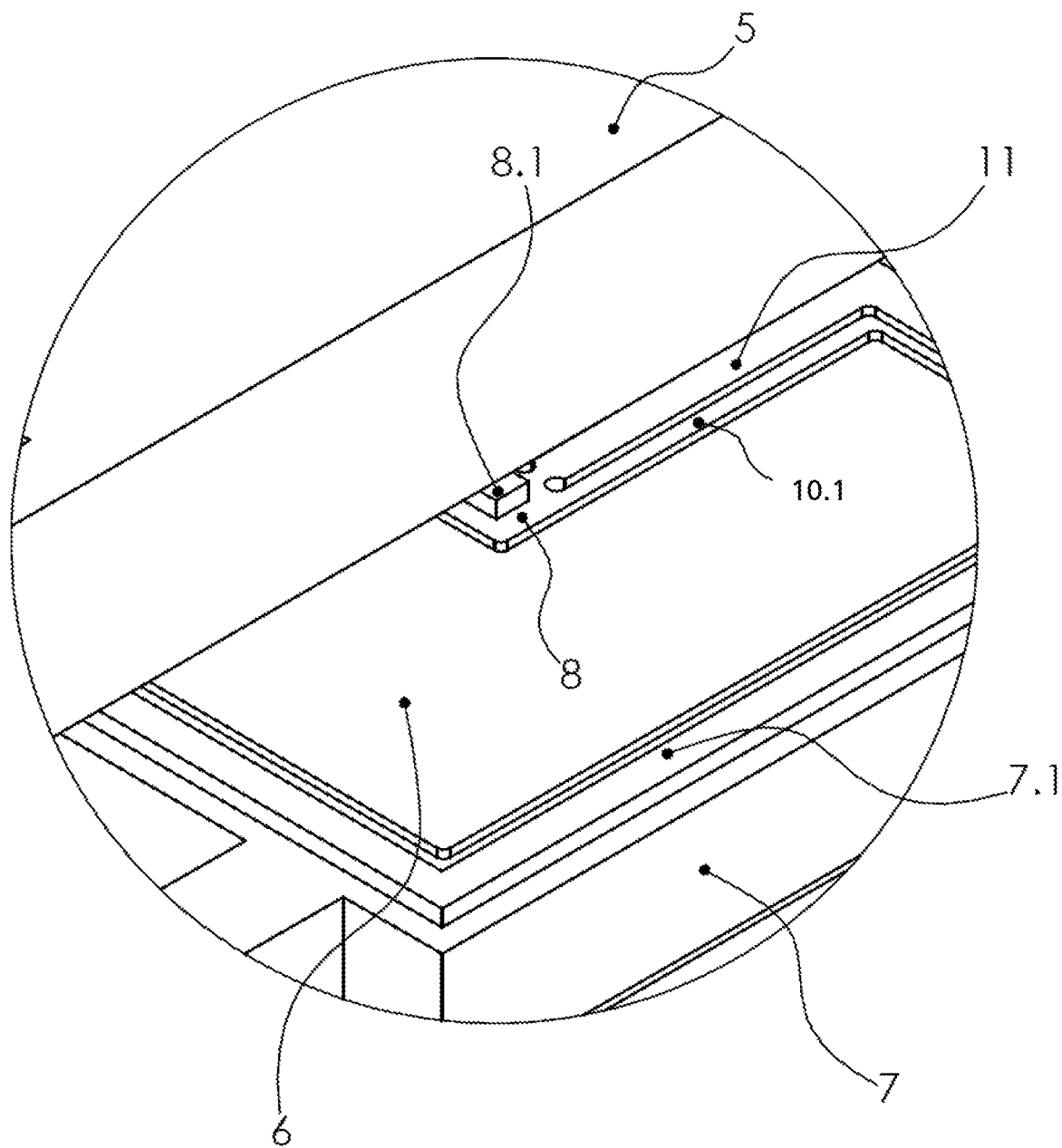
FIG. 3 shows an enlarged view of a detail of FIG. 2.
Figure 4:
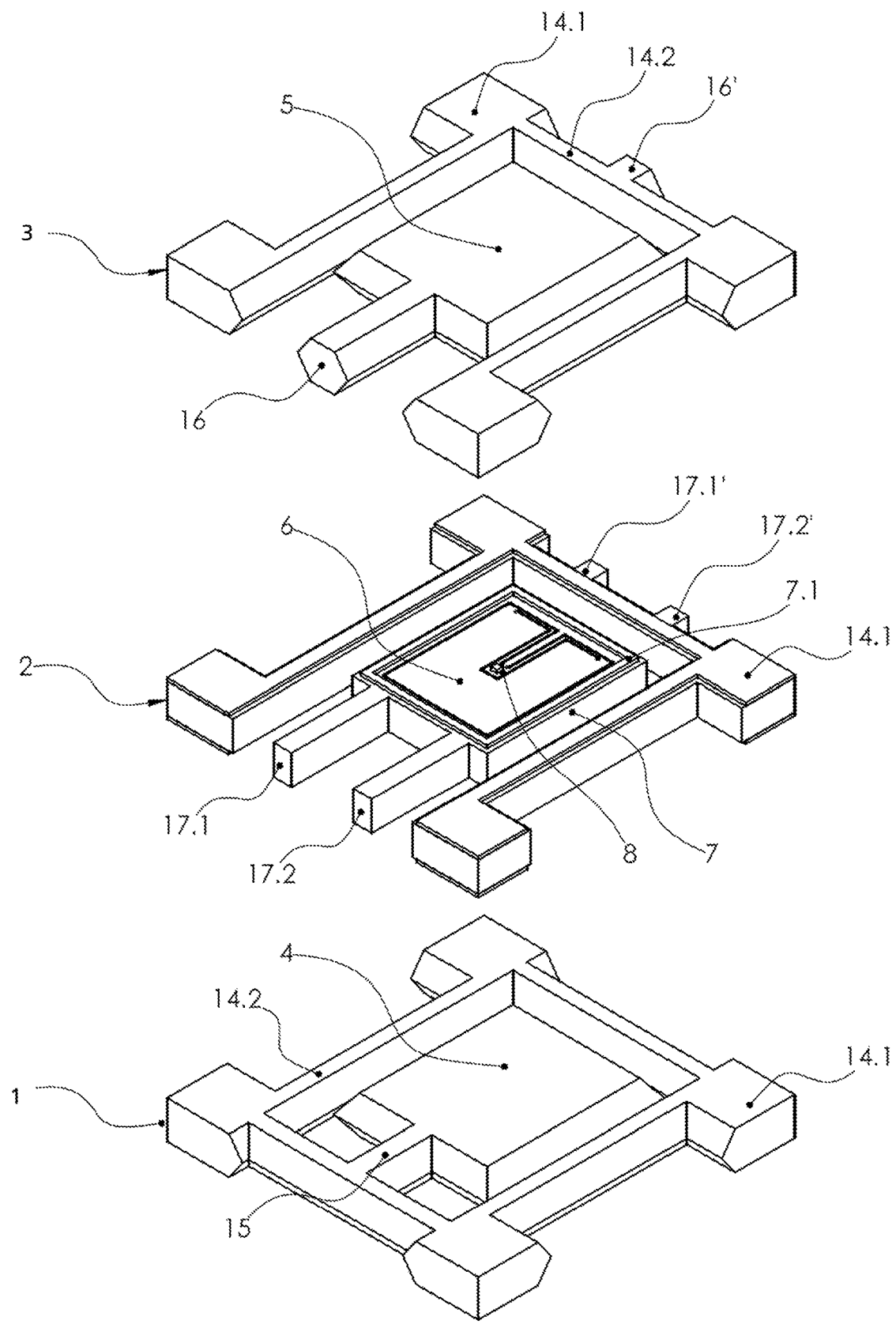
FIG. 4 shows an explosion view of the accelerometer of FIG. 1.

In a preferred embodiment of the first step, the parts of each plane are etched together with the parts of the respective planes of multiple other identical accelerometers. The wafer design is chosen such that the parts of the first plane of multiple accelerometers are all still connected by the first wafer layer 1 after the etching process. The same holds for the parts of the second plane and the third plane. For example, the decoupling frame 14 of the first plane remains connected after etching with the attach-islands of the first plane of the decoupling frame 14 of the neighbouring accelerometers. For example, the second capacitor 5 remains after etching connected with a beam 16 to the decoupling frame 14 of the third plane of a neighbouring accelerometer. This helps to fix the positional relationship between the parts, because the decoupling frame 14 in the third plane and the second capacitor plate 5 of the same accelerometer are not connected with each other. In fact, FIGS. 1, 2 and 4 show the rest of the beam 16' of the neighbouring accelerometer. For example, the mass frame 7 (holding over the pillar 8 the seismic mass 6) remains after etching connected with beams 17.1 and 17.2 to the decoupling frame 14 of the second plane of a neighbouring accelerometer. This helps to fix the positional relationship between the parts, because the decoupling frame 14 in the second plane and the mass frame 7 of the same accelerometer are not connected with each other. In fact, FIGS. 2 and 4 show the rest of the beams 17.1' and 17.2' of the neighbouring accelerometer connected to the decoupling frame 14 of the second plane of the shown accelerometer after etching.

In a preferred embodiment, the second step comprises the following steps. First, the second silicon wafer layer 2 is arranged over the first silicon wafer layer 1 and the third silicon wafer layer 3 is arranged over the second silicon wafer layer 2 such that a stack of three silicon wafer layers 1, 2, 3 is achieved. The three silicon wafer layers 1, 2, 3 are arranged or stacked above each other such that the relative positional relationship of the first capacitor plate 4, the mass frame 7 and the second capacitor plate 5 are fulfilled for each of the accelerometers. As seen in FIG. 2, the beams 17.1 and 17.2 are off-set from the decoupling beam 15 and/or not bonded to the decoupling beam 15. This has the advantage of not further stressing the decoupling beam 15 and can thus not lead to a breakage of the decoupling beam. The off-set avoids further that no particles can be trapped between the two layers and cause electrical leakage. Second, the three silicon wafer layers 1, 2, 3 are fixed to each other in this position. This is achieved preferably by silicon fusion bonding. Therefore, a silicon oxide layer 7.1, 8.1 is arranged between the mass frame 7 and the second capacitor plate 5 and the first capacitor plate 4 which defines a fixed gap between the seismic mass 6 and the capacitor plates 4 and 5 and electrically insulates the three silicon layers 1, 2, 3. The wafer layers of the decoupling frame can also be connected by a silicon oxide layer. Silicon fusion bonding has the advantage of being very stable over time, thus avoiding any stress relaxation over time which would result in bias drift. Third, the different accelerometers are singulated into individuals accelerometers by a wafer dicing process.

This accelerometer wafer diced from the triple stack formed by three silicon wafer layers 1, 2, 3 is mounted, preferably by adhesive connection, on a package electrically connected, preferably by wire bonding, to the first capacitor plate 4, the second capacitor plate 5 and the seismic mass 6. The beam 16 can be used for wire bonding the second capacitor plate 5 to the package. The beams 17.1 and/or 17.2 can be used for wire bonding the seismic mass 6 to the package. The decoupling beam 15 can be used for wire bonding the first capacitor plate 4 to the package.

In a further advantageous embodiment, a lid of the package has the same distance to the second capacitor plate 5 as a mounting surface of the package to the first capacitor plate 4. If the lid is mounted above the second capacitor plate 5 with the same gap as the mounting surface of the package to the first capacitor plate 4, bias shift is reduced. Indeed in an atmospheric sealed package, the heat flow to the accelerometer die is dominated by thermal conduction of the air. Thus equalizing the thermal resistance path to the first capacitor plate 4 with the second capacitor plate 5 allows symmetric distribution of heat to the die. This is achieved by designing equal distance from the lid to the second capacitor plate 5 and from the mounting surface of the package to the first capacitor plate 4. This reduces the bias shift due to spatial temperature gradients.

The invention claimed is:

1. An accelerometer comprising a first capacitor plate in a first plane, a second capacitor plate in a third plane parallel to the first plane and a seismic mass and a mass frame in a second plane parallel to the first plane, wherein the seismic mass is arranged between the first capacitor plate and the second capacitor plate, wherein the mass frame is arranged around the seismic mass and connects the first capacitor plate and the second capacitor plate, wherein a sensor box is formed by the first capacitor plate, the mass frame and the second capacitor plate, wherein the first capacitor plate and the second capacitor plate are configured to detect movements of the seismic mass out of the second plane;

wherein
the mass frame comprises a pillar extending from the first capacitor plate to the second capacitor plate through a cut-out in the seismic mass, wherein the mass frame is connected to the first capacitor plate and to the second capacitor plate for stiffening the sensor box.

2. The accelerometer according to claim 1, wherein the seismic mass is anchored via at least one elastic beam to the pillar, wherein a first end of the at least one elastic beam is connected to the pillar and a second end of the at least one elastic beam is connected to the seismic mass.

3. The accelerometer according to claim 2, wherein the cut-out in the seismic mass extends from the pillar to a first lateral side wall of the seismic mass, wherein the at least one elastic beam extends from the pillar through the cut-out to the first lateral side wall.

4. The accelerometer according to claim 3, wherein the at least one elastic beam extends further along the first lateral side wall.

5. The accelerometer according to claim 4, wherein the second end of the at least one elastic beam is connected to a corner of the seismic mass.

6. The accelerometer according to claim 2, wherein the at least one elastic beam comprises two elastic beams arranged symmetrically to a longitudinal axis of the cut-out.

7. The accelerometer according to claim 2, wherein a beam extending through the cut-out connects the pillar with the mass frame, wherein the mass frame is mechanically connected with the first capacitor plate and the second capacitor plate.

8. The accelerometer according to claim 1, wherein the pillar is arranged in a central region comprising centered fifty percent of a distance between opposed lateral side walls of the seismic mass.

9. The accelerometer according to claim 1, comprising a decoupling frame supporting via a decoupling beam the sensor box, wherein the decoupling frame is arranged to be attached on a package such that the sensor box is not connected directly with the package, but only through the decoupling beam.

10. The accelerometer according to claim 9, wherein the decoupling frame has first portions with a first width for adhesively connecting the decoupling frame on a package and second portions with a second width connecting two neighbouring first portions, wherein the first width is larger than the second width.

11. The accelerometer according to claim 10, wherein the first portions are arranged at corners of the decoupling frame.

12. The accelerometer according to claim 1, wherein the first capacitor plate and the second capacitor plate are each thicker than 500 micrometre and/or the seismic mass is thicker than 400 micrometre.

13. The accelerometer according to claim 1, wherein the sensor box hermetically encloses the seismic mass.

* * * * *